(12) United States Patent
Liu et al.

(10) Patent No.: US 8,138,579 B2
(45) Date of Patent: Mar. 20, 2012

(54) STRUCTURES AND METHODS OF FORMING SIGE AND SIGEC BURIED LAYER FOR SOI/SIGE TECHNOLOGY

(75) Inventors: Xuefeng Liu, South Burlington, VT (US); Robert M. Rassel, Colchester, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 477 days.

(21) Appl. No.: 11/867,995

(22) Filed: Oct. 5, 2007

(65) Prior Publication Data

US 2009/0001417 A1    Jan. 1, 2009

Related U.S. Application Data

(63) Continuation-in-part of application No. 11/770,908, filed on Jun. 29, 2007, now Pat. No. 7,989,306.

(51) Int. Cl.
*H01L 23/58* (2006.01)
(52) U.S. Cl. ............... 257/635; 257/344; 716/1
(58) Field of Classification Search .......... 257/635, 257/344; 716/1
See application file for complete search history.

(56) References Cited

U.S. PATENT DOCUMENTS

| | | | |
|---|---|---|---|
| 5,882,987 A | 3/1999 | Srikrishnan | |
| 6,288,427 B2 | 9/2001 | Huang | |
| 6,365,488 B1 | 4/2002 | Liao | |
| 6,432,754 B1 | 8/2002 | Assaderaghi et al. | |
| 6,621,131 B2 | 9/2003 | Murthy et al. | |
| 6,765,227 B1 | 7/2004 | Yu et al. | |
| 6,833,332 B2 | 12/2004 | Christiansen et al. | |
| 6,914,301 B2 | 7/2005 | Bae et al. | |
| 6,938,237 B1 * | 8/2005 | El-Ghoroury | 716/18 |
| 7,265,004 B2 | 9/2007 | Thean et al. | |
| 7,554,138 B2 | 6/2009 | Meunier-Beillard et al. | |
| 2002/0139977 A1 | 10/2002 | Bae et al. | |
| 2002/0168802 A1 | 11/2002 | Hsu et al. | |
| 2003/0199126 A1 | 10/2003 | Chu et al. | |
| 2008/0168418 A1 | 7/2008 | Zia et al. | |
| 2008/0274595 A1 | 11/2008 | Spencer et al. | |

FOREIGN PATENT DOCUMENTS

GB    2400731    10/2004

OTHER PUBLICATIONS

Office Action for corresponding U.S. Appl. No. 11/770,908.
Final Office Action for corresponding U.S. Appl. No. 11/770,908.

(Continued)

*Primary Examiner* — Samuel Gebremariam
(74) *Attorney, Agent, or Firm* — Anthony Canale; Roberts Mlotkowski Safran & Cole, P.C.

(57) ABSTRACT

Semiconductor structures and methods of forming semiconductor structures, and more particularly to structures and methods of forming SiGe and/or SiGeC buried layers for SOI/SiGe devices. An integrated structure includes discontinuous, buried layers having alternating Si and SiGe or SiGeC regions. The structure further includes isolation structures at an interface between the Si and SiGe or SiGeC regions to reduce defects between the alternating regions. Devices are associated with the Si and SiGe or SiGeC regions. The invention is also directed to a design structure on which a circuit resides.

23 Claims, 14 Drawing Sheets

OTHER PUBLICATIONS

Design and Fabrication of MOSFETs with a Reverse Embedded SiGe (Rev. e-SiGe), 3pgs., Semiconductor R&D Center (SRDC), IBM Systems and Technology Group, Hopewell Junction, NY 12533 (date unknown).

Non-Final Office Action dated Jan. 14, 2010 in U.S. Appl. No. 11/770,908.
Final Office Action dated Oct. 28, 2010 in U.S. Appl. No. 11/770,908.
Notice of Allowance dated Mar. 21, 2011, for corresponding U.S. Appl. No. 11/770,908.

* cited by examiner

STRUCTURES AND METHODS OF FORMING SIGE AND SIGEC BURIED LAYER FOR SOI/SIGE TECHNOLOGY

CROSS-REFERENCE TO RELATED APPLICATIONS

The present application is a continuation in part of U.S. application Ser. No. 11/770,908, filed on Jun. 29, 2007 now U.S. Pat. No. 7,989,306, the disclosure of which is expressly incorporated by reference herein in its entirety.

FIELD OF THE INVENTION

The invention relates to semiconductor structures and methods of forming semiconductor structures, and more particularly to structures and methods of forming SiGe and/or SiGeC buried layers for CMOS/BiCMOS and passive devices over Si or SOI substrates. The invention is also directed to a design structure on which a circuit resides.

BACKGROUND DESCRIPTION

Generally, metal-oxide semiconductor transistors include a substrate made of a semiconductor material, such as silicon. The transistors typically include a source region, a channel/well region and a drain region within the substrate. The channel/well region is located between the source and the drain regions. A gate stack, which usually includes a conductive material, a doped poly Si, a gate oxide layer and sidewall spacers, is generally provided above the channel/well region. More particularly, the gate oxide layer is typically provided on the substrate over the channel region, while the gate conductor is usually provided above the gate oxide layer.

The amount of current flowing through a channel is generally directly proportional to the mobility of the carriers in the channel. Thus, by increasing the mobility of the carriers in the channel, the operation speed of the transistor can be increased. Also, mechanical stresses within a semiconductor device can modulate device performance by, for example, increasing the mobility of the carriers in the semiconductor device. Thus, to improve the characteristics of a semiconductor device, tensile and/or compressive stresses are created in the channel of the n-type devices (e.g., NFETs) and/or p-type devices (e.g., PFETs). However, the same stress component, for example tensile stress or compressive stress, improves the device characteristics of one type of device (i.e., n-type device or p-type device) while discriminatively affecting the characteristics of the other type device. Also, some devices do not require tensile and/or compressive stresses in the substrate.

Also with the progress of CMOS scaling, the distance from source to drain is greatly shortened. Therefore the doping of source/drain and the LDD (lightly doped drain) have to be limited to prevent device punch through. This limitation requires source/drain and extension dose reduction, which will impact the device performance. Because of this, there is a need to keep the same doping level in the source/drain and extension but confine the dopant diffusion.

While known methods provide structures that have tensile stresses applied to the NFET device and compressive stresses applied along the longitudinal direction of the PFET device, they may require additional materials and/or more complex processing, and thus, resulting in higher cost. Thus, it is desired to provide more cost-effective and simplified methods for creating large tensile and compressive stresses in the channels NFETs and PFETs, respectively.

SUMMARY OF THE INVENTION

In a first aspect of the invention, an integrated structure comprises discontinuous, buried layers having alternating Si and SiGe or SiGeC regions. The structure further includes isolation structures at an interface between the Si and SiGe or SiGeC regions to reduce defects between the alternating regions. Devices are associated with the Si and SiGe or SiGeC regions.

In another aspect of the invention, an integrated structure comprises a substrate and alternating Si and SiGe or SiGeC regions formed on the substrate. Isolation structures are at an interface between the Si and SiGe or SiGeC regions. A buried oxide (BOX) layer is formed above the substrate. A first type device is associated with the Si regions and a second type device is associated with the SiGe or SiGeC regions.

In yet another aspect of the invention, a method of forming an integrated structure comprises forming SiGe or SiGeC regions alternating with Si regions on a substrate from continuous layer of SiGe or SiGeC material or Si material formed over the substrate. The method further includes forming isolation structures at interfaces between the SiGe or SiGeC regions and the alternating Si regions. A buried oxide layer is formed over the substrate.

In yet another aspect of the invention, a design structure is embodied in a machine readable medium for designing, manufacturing, or testing a design. The design structure comprises: discontinuous, buried layers having alternating Si and SiGe or SiGeC regions; isolation structures at an interface between the Si and SiGe or SiGeC regions to reduce defects between the alternating regions; and devices associated with the Si and SiGe or SiGeC regions.

In embodiments, the design structure comprises a netlist, which describes the circuit. The design structure resides on storage medium as a data format used for the exchange of layout data of integrated circuits. The design structure includes at least one of test data files, characterization data, verification data, or design specifications. The design structure further comprises: a substrate; alternating Si and SiGe or SiGeC regions formed on the substrate; isolation structures at an interface between the Si and SiGe or SiGeC regions; a buried oxide (BOX) layer formed above the substrate; a first type device associated with the Si regions; and a second type device associated with the SiGe or SiGeC regions.

DETAILED DESCRIPTION OF EMBODIMENTS OF THE INVENTION

This invention is directed to semiconductor structures and methods of manufacturing the semiconductor structures, and more particularly to structures and methods of forming SiGe and SiGeC buried layers for CMOS/BiCMOS and passive devices over Si or SOI substrates. In embodiments, the structures are formed on a silicon substrate which includes discontinuous buried layers having alternating regions of silicon and SiGe or SiGeC. In further embodiments, isolation trenches extend through the buried layer at the Si and SiGe or SiGeC interfaces to reduce defects between the alternating regions. This SiGe(C) film, for example, can be used to form the channel/well so the dopant diffusion can be suppressed.

More specifically, multiple structures and methods are developed in accordance with the invention by burying SiGe and/or SiGeC films, doped and undoped, in conventional Si and SOI wafers to improve device characteristics, e.g., high voltage CMOS, PIN diode, high performance CMOS, circuit body effect, substrate current reduction and noise cross-talk, etc. The SiGe and/or SiGeC profiling has the capabilities to allow for bandgap modulation and formation of built in electric fields.

FIGS. 1-6 show structures according to a first embodiment of the invention. In this implementation, the SiGe or SiGeC film is formed above a BOX. As in each of the embodiments, the SiGe or SiGeC regions may be non-doped, or n-typed doped or p-typed doped, depending on the particular application.

Figure 1:
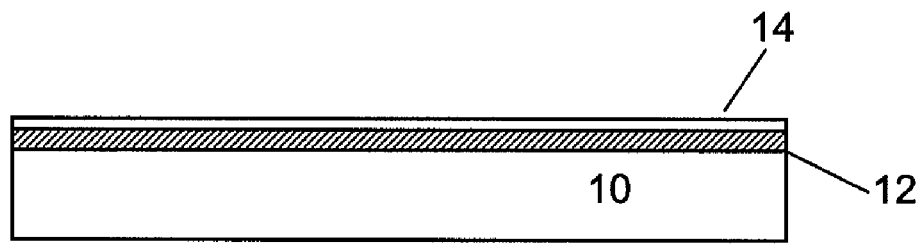
FIGS. 1-6 show structures according to a first embodiment of the invention.

FIG. 1 shows a starting structure comprising an optional BOX layer 12 formed on a silicon wafer 10. In embodiments, the BOX layer 12 is an oxide layer in a Si substrate. The oxide buried in the silicon wafer can be a depth ranging from less than 100 nm to several micrometers from the wafer surface, depending on the application. In embodiments, the thickness of the BOX layer 12 is in the range from about 40 nm to about 100 nm. A silicon (Si) film 14 is formed on the BOX layer 12.

Figure 2:
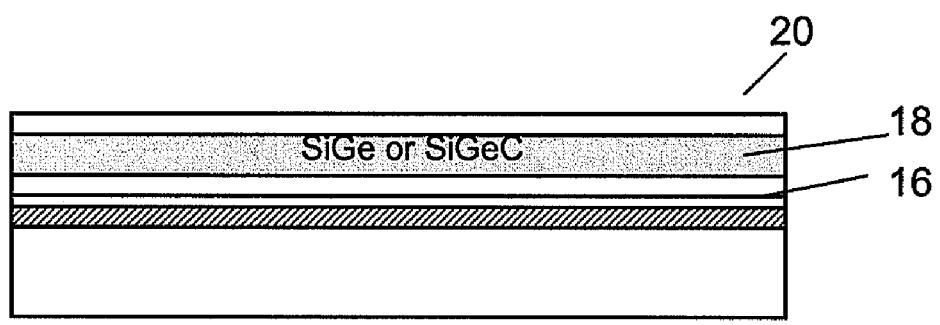

In FIG. 2, an optional buffer layer 16 is formed on the Si film 14. The optional buffer layer 16 may be a Si which is grown on the Si film 14. The optional buffer layer 16 forms a smooth, planar upper surface for further processing steps, thereby preventing any defects. As further shown in FIG. 2, a SiGe or SiGeC film 18 is formed on the buffer layer 16. In embodiments, the SiGe or SiGeC film 18 can be anywhere upwards of 4000 Å and in further embodiments can be about 5000 Å. The SiGe or SiGeC layer may be formed by conventional deposition methods such as, for example, low temperature epitaxy chemical vapor deposition (LTECVD). A Silicon (Si) epi layer 20 is formed on the SiGe or SiGeC film 18. The Ge and C composition can be in the range from any upwards to 40% and 5%, respectively.

Figure 3:
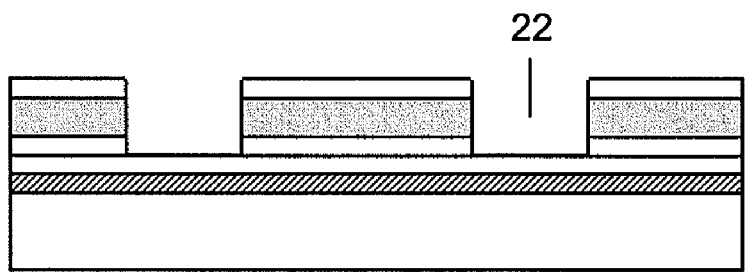

FIG. 3 represents a selective etching process to form troughs in the structure of FIG. 2. In this representative processing, a reactive ion etching (RIE) is undertaken to form troughs 22 to the underlying buffer layer 16. This RIE process is provided so that in the final structure only selective devices are formed on the SiGe or SiGeC film 18.

Figure 4:
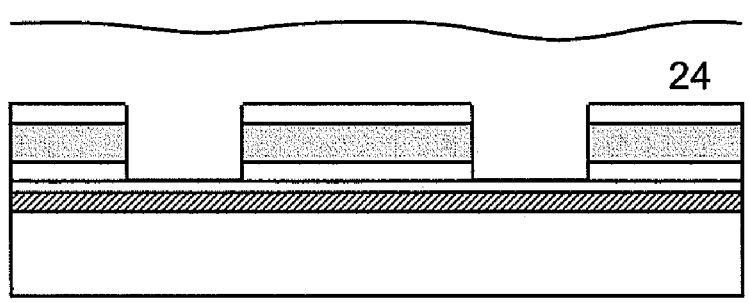

In FIG. 4, a second Si epi layer 24 is formed over the entire structure. This process includes filling the troughs 22 with the Si epi layer 24.

Figure 5:
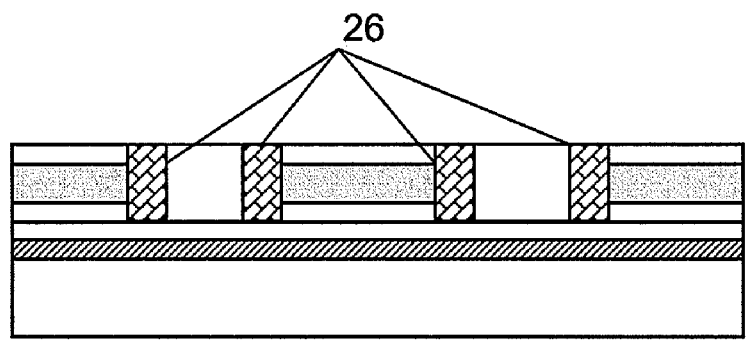

In FIG. 5, a chemical mechanical polishing (CMP) is performed to planarize the structure. Also, in a conventional manner, isolation structures 26 are formed between the interfaces of the Si epi layer 24 and SiGe or SiGeC film 18. The isolation structures may include, for example, shallow trench isolation structures (STI), deep trench isolation structures (DT) and/or trench isolation structures (TI), any of which will eliminate the defects which may exist between the interfaces of the Si layer and SiGe or SiGeC film. In embodiments, the STI structures may be about 4000 Å in depth, the TI structure may be about 2.5 microns and the DT structures may be about six microns in depth, any of which depend on the specific heights applications.

FIGS. 6-13 show structures according to a second embodiment of the invention. In this implementation, the SiGe or SiGeC film is formed above the BOX.

Figure 6:
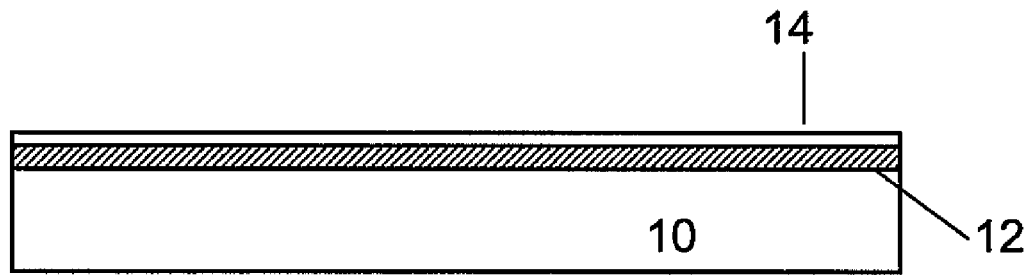

FIG. 6 shows a starting structure comprising an optional BOX layer 12 formed on a silicon wafer 10. In embodiments, the BOX layer 12 is similar to that discussed with reference to FIG. 1. A silicon film 14 is formed on the BOX layer 12.

Figure 7:
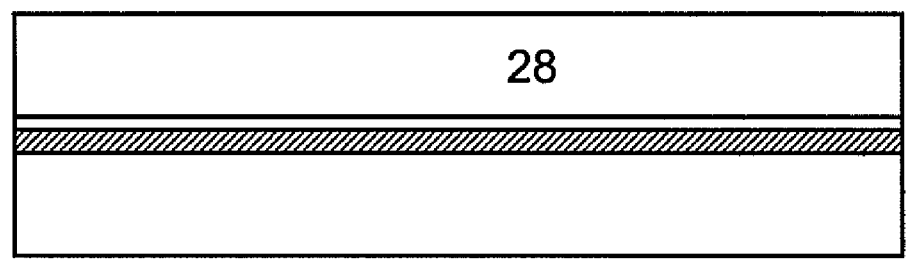
FIGS. 7-13 show structures according to a second embodiment of the invention.

In FIG. 7, an Si epi layer 28 is formed on the Si film 14. The Si epi layer 28 is formed to make a smooth upper surface for further processing steps, thereby preventing any defects in the final device.

Figure 8:
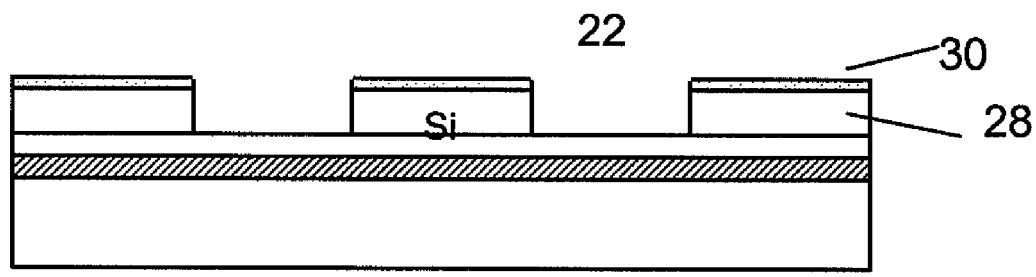

As further shown, in FIG. 8 a silicon dioxide or silicon nitride layer 30 is formed over the Si epi layer 28. The silicon dioxide or silicon nitride layer 30 is a hardmask, which is used for subsequent formation of troughs 22. The trough depth is preferably to the Si film 14. By way of one illustrative example, a conventional photolithographic process is then performed to form the trough etch openings 22, the hardmask is then removed from the opening as shown in the structure of FIG. 8. Then photoresist is stripped and troughs etch is conducted using remaining silicon dioxide or silicon nitride layer as the hardmask. The etch depth may be anywhere upwards of 4000 Å and in further embodiments can be about 5000 Å.

Figure 9:
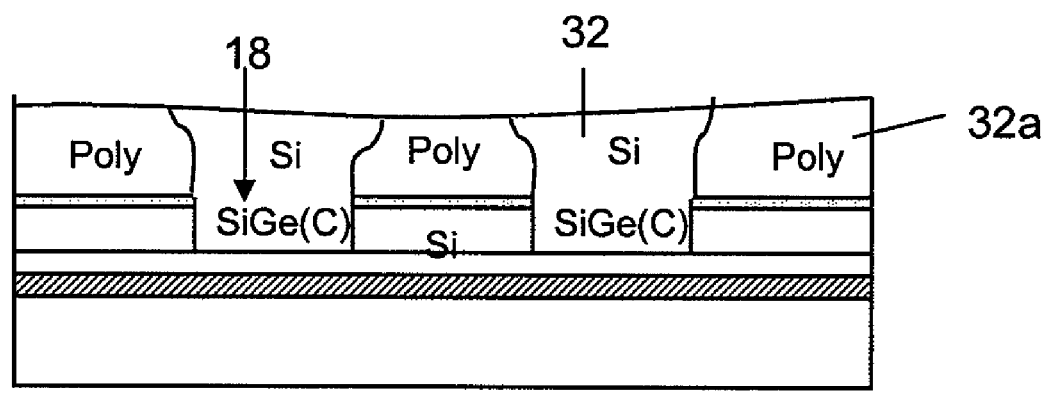

As shown in FIG. 9, an SiGe or SiGeC film 18 is grown in the troughs 22. A silicon film 32 is formed on the SiGe or SiGeC film 18 and the remaining structure. In embodiments, the silicon film 32 may be formed by chemical vapor deposition (CVD) processes well known to those of skill in the art. As one of skill in the art should further understand, the silicon film 32 will form a polysilicon 32a over the silicon dioxide or silicon nitride 30 since there is no seed to nucleate to form single crystal. That is, the silicon will grow randomly forming the polysilicon 32a. In contrast, the silicon film 32 will remain in a single crystal form over the SiGe or SiGeC film 18.

Figure 10:
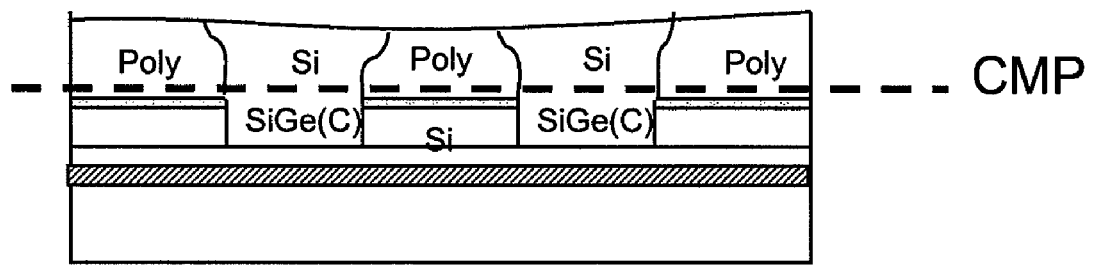

As represented in FIG. 10, a chemical mechanical polishing (CMP) process is performed on the structure formed in FIG. 9. The CMP will remove the damaged areas of the polysilicon 32a and silicon film 32.

Figure 11:
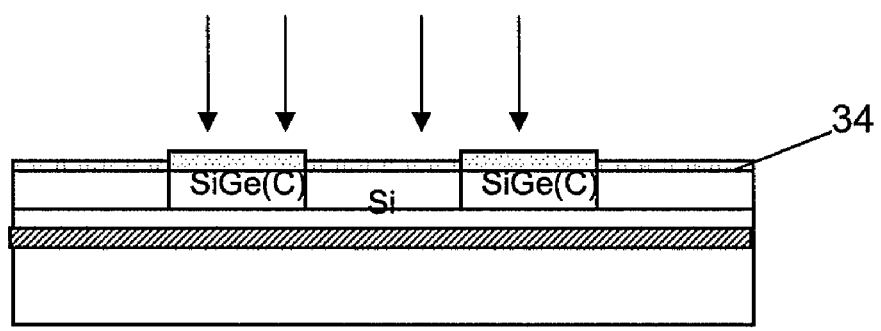

In FIG. 11, an oxidation process is performed on the structure. In this manner, an oxide layer (dielectric layer) 34 is formed over the structure. The oxidation process may be performed by any conventional oxidation growing process.

Figure 12:
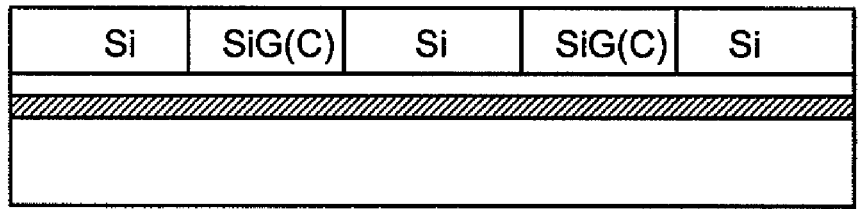

In FIG. 12, the oxide layer (dielectric layer) 34 is wet stripped using any well known stripping process. For example, the oxide layer (dielectric layer) 34 may be stripped using wet chemical processing.

Figure 13:
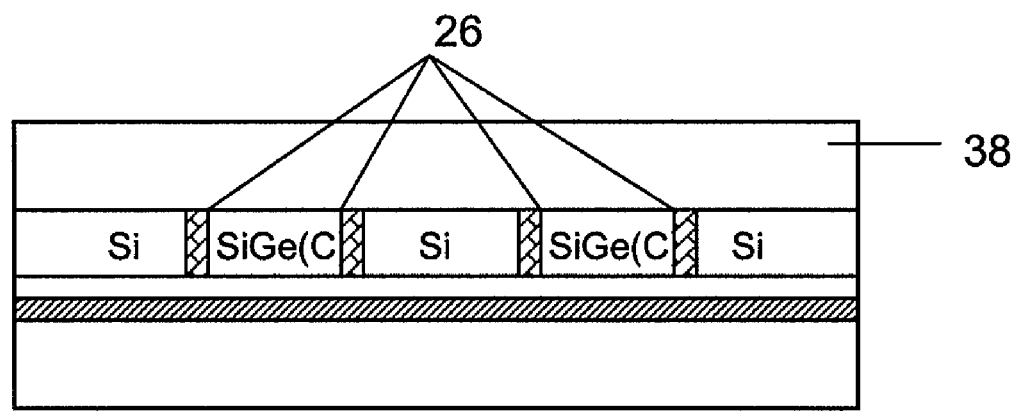

In FIG. 13, after the wet strip process, in a conventional manner, isolation structures 26 are formed between the interfaces of the Silicon layer 28 and SiGe or SiGeC film 18. As discussed above, the isolation structures may include, for example, shallow trench isolation structures (STI), deep trench isolation structures (DT) and/or trench isolation structures (TI), any of which will be eliminate the defects which may exist between the interfaces of the Si layer 28 and SiGe or SiGeC film 18. In embodiments, the STI structures may be about 4000 Å, the TI structure may be about 2.5 microns and the DT structure may be about six microns, as discussed above. As further shown in FIG. 13, an Si epi layer 38 may be formed over the structure. In embodiments, the Si epi layer 38 may be anywhere upwards of about 200 to 300 Å, and more preferably about 50 to 200 nm.

Figure 14:
FIGS. 14-22 show structures according a third embodiment of the invention.

FIGS. 14-22 show structures according a third embodiment of the invention. In this implementation, the SiGe or SiGeC film is formed below the BOX. FIG. 14 shows a starting structure comprising a silicon wafer 10.

Figure 15:
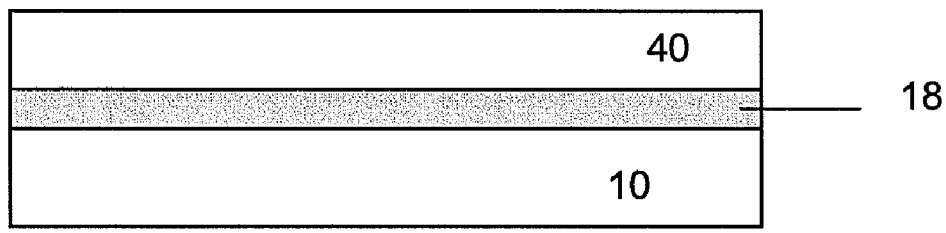

In FIG. 15, a SiGe or SiGeC film 18 is formed on the silicon wafer 10. In embodiments, the SiGe or SiGeC film 18 is grown on the silicon wafer 10. A silicon layer 40 is grown on the SiGe or SiGeC film 18. The silicon layer 40 may be about 500 Å; although the silicon layer 40 may comprise different thicknesses as contemplated by the invention.

Figure 16:
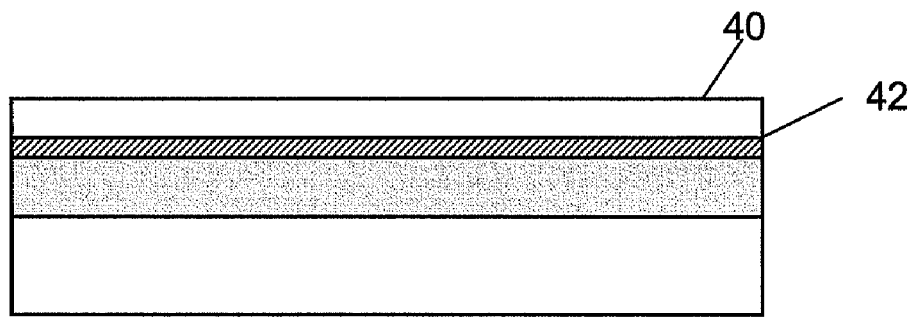

In FIG. 16, an oxide layer (dielectric layer) 42 is formed via an oxygen ion implantation process. The oxidation process may be performed by any conventional oxidation implantation process. For example, a conventional SIMOX activation process is contemplated by the invention. In this manner, oxygen ions are implanted into the Si layer to form a buried oxide layer. The ion implantation energy is in a range of about 100 Kev to 250 kev. The oxygen dose is in a range of about 5E16 to 1E18 cm$^{-2}$. The operating temperature is in a range of about 500 to 600° C.

Figure 17:
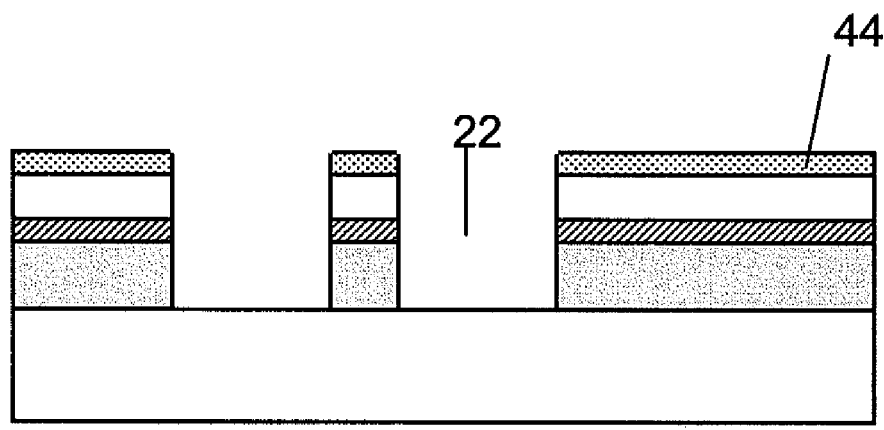

As shown in FIG. 17, a silicon dioxide or silicon nitride layer 44 is formed over the Si epi layer 40, which is worked as a hardmask. In a conventional manner, the hardmask is used for subsequent formation of troughs 22, preferably to the underlying substrate. By way of one illustrative example, a conventional photolithographic process is then performed over the hardmask layer to form the troughs 22. The dielectric is removed at the trough region to form the structure of FIG. 17. The etch depth may be anywhere upwards of 4000 Å and in further embodiments can be about 5000 Å.

Figure 18:
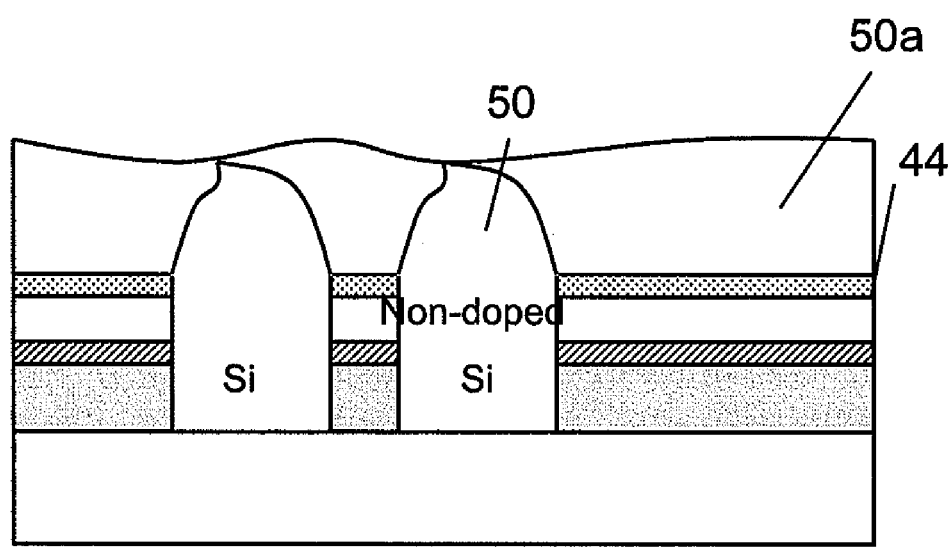

In FIG. 18, a non-doped silicon film 50 is grown over the structure of FIG. 17, including within the troughs 22. In embodiments, the silicon film 50 may be formed by chemical vapor deposition (CVD) processes well known to those of skill in the art. As one of skill in the art should understand, the silicon film 50 will form a polysilicon 50*a* over the silicon dioxide or silicon nitride 44 since there is no seed to nucleate. That is, the silicon will grow randomly forming the polysilicon 50*a*. In contrast, the silicon film 50 will remain in a single crystal form over the SiGe or SiGeC film 18.

Figure 19:
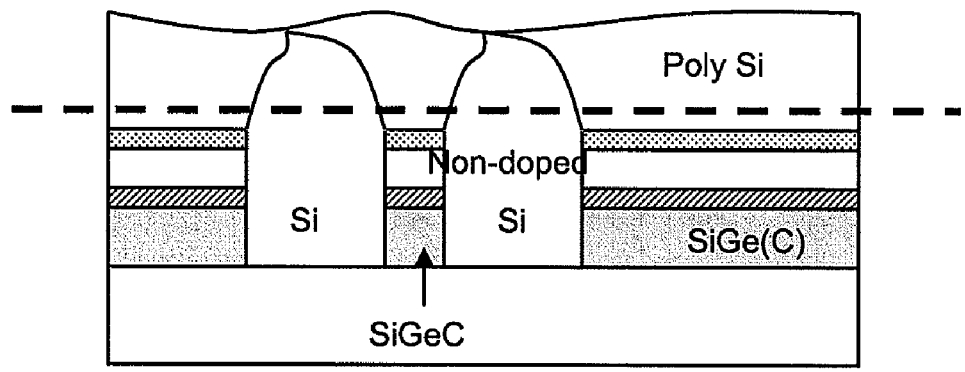

As represented in FIG. 19, a chemical mechanical polishing (CMP) process is performed on the structure. The CMP will remove the damaged areas of the polysilicon 50*a* and silicon film 50 down to the level of layer 44.

Figure 20:
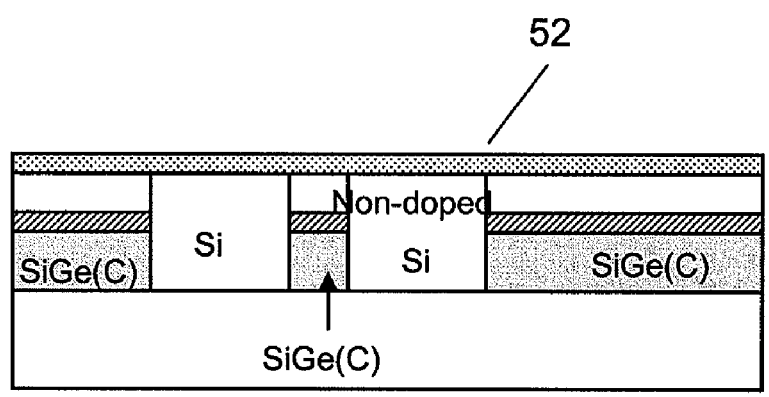

In FIG. 20, a reoxidation process forms an oxide layer (dielectric layer) 52 on the structure. The reoxidation process is a conventional process, well known to those of ordinary skill in the art such as discussed above. The oxide layer 52 is wet cleaned using conventional processes such as, for example, a DHF process using dilute HF or buffered HF (BHF). In embodiments, the wet cleaning process removes contaminants from the wafer surface in the liquid-phase. As is known to those of skill in the art, wet cleaning chemistries are selected to form soluble compounds of surface contaminants; often enhanced by megasonic agitation and followed by deionized water rinse and dry cycle, for example.

Figure 21:
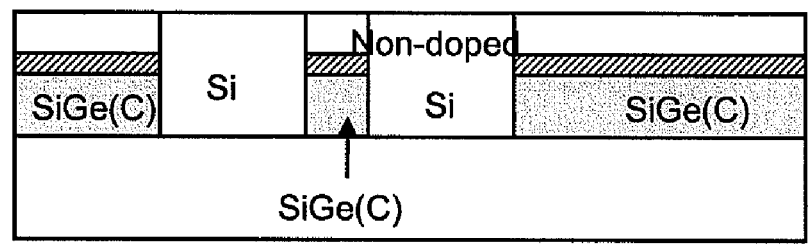
Figure 22:
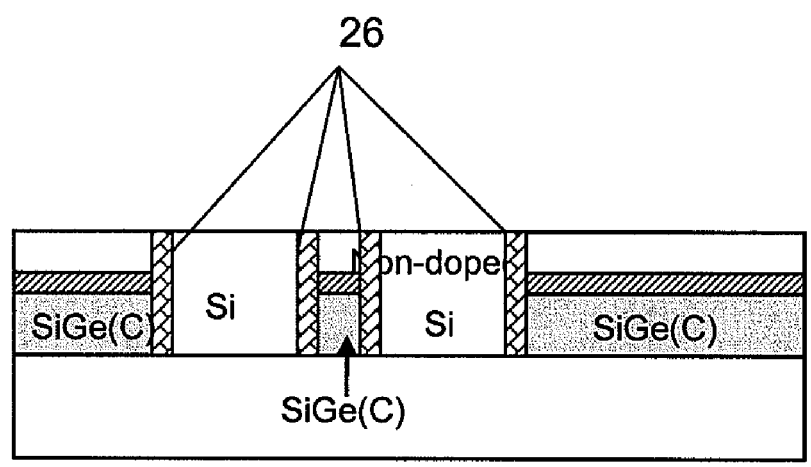

FIG. 21 shows a structure with smooth starting surface after wet clean process. In FIG. 22, in a conventional manner, isolation structures 26 (as discussed above) are formed between the interfaces of the Si and SiGe or SiGeC film. As discussed above, the isolation structures may include, for example, shallow trench isolation structures (STI), deep trench isolation structures (DT) and/or trench isolation structures (TI), any of which will be eliminate the defects which may exist between the interfaces of the Si layer and SiGe or SiGeC film.

Figure 23:
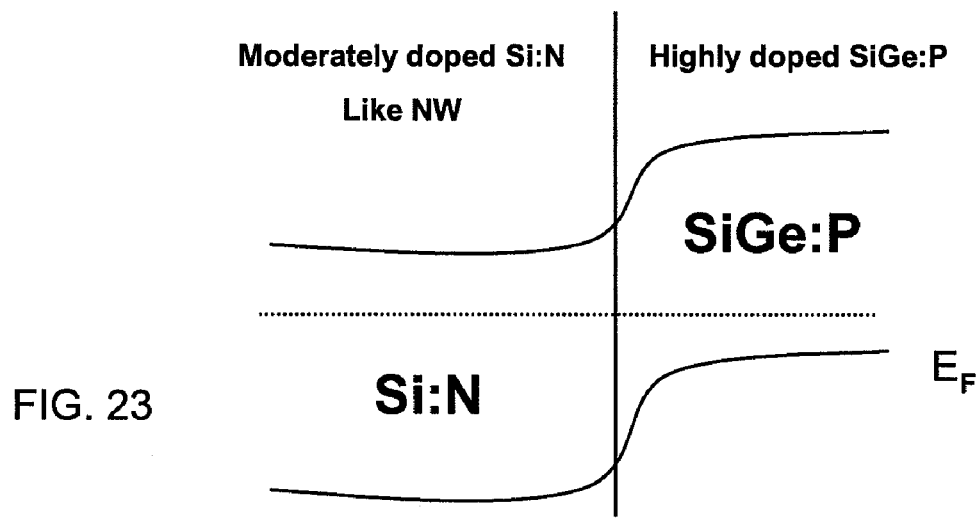
FIG. 23 shows a schematic representation of a band alignment in accordance with an implementation of the invention.

FIG. 23 shows a schematic representation of a band alignment in accordance with an implementation of the invention. As schematically shown, due to the fact of the band gap barrier, electrons, for example, in a FET, is more difficult to flow to the substrate due to the barrier provided by the SiGe (or SiGeC) doped areas of the structure. In this manner, the SiGe (or SiGeC) doped areas will direct the electrons into the source of the device which is normally grounded, blocking the electrons from flowing into the substrate. This will substantially decrease device leakage to the substrate or prevent the body current generated from other parts flow to this device.

Figure 24:
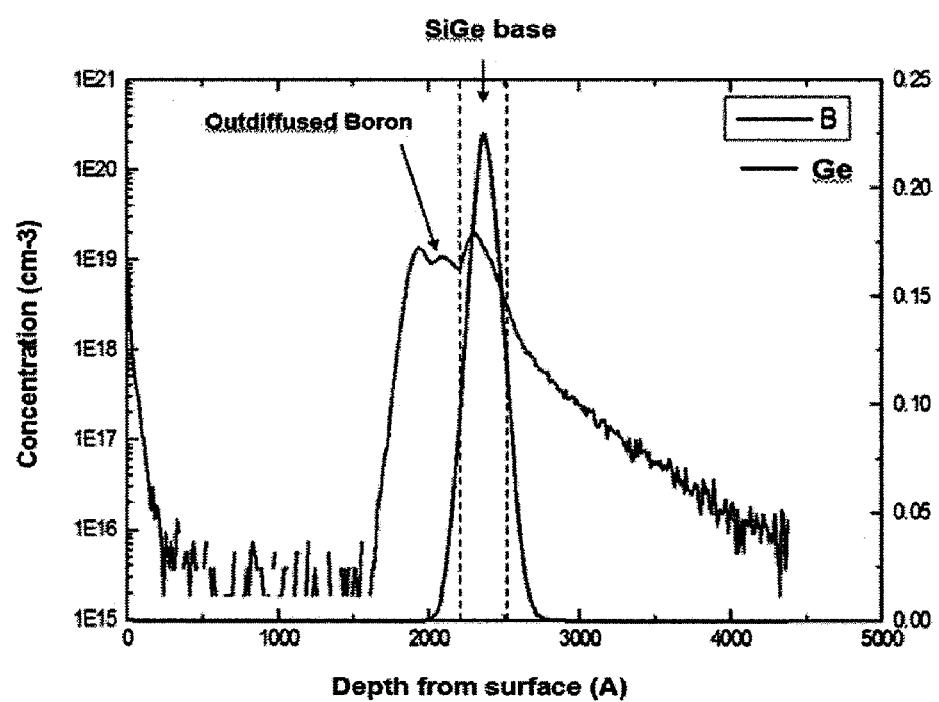
FIG. 24 shows a graph of out diffusion of Boron in a structure implementing aspects of the invention.

FIG. 24 shows a graph depicting out diffusion of Boron in a structure implementing aspects of the invention. In this graph, the diffusion of Boron is significantly decreased over SiGe (or SiGeC) doped areas of the structure. More specifically, out diffusion of Boron significantly decreases at SiGe (and SiGeC) doped areas. In this manner, in scaled devices implementing the structures of the invention, where the source and drain are very close together (e.g., 0.1 micron or less), the boron will not out diffuse and cause shorting of the device.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 25:
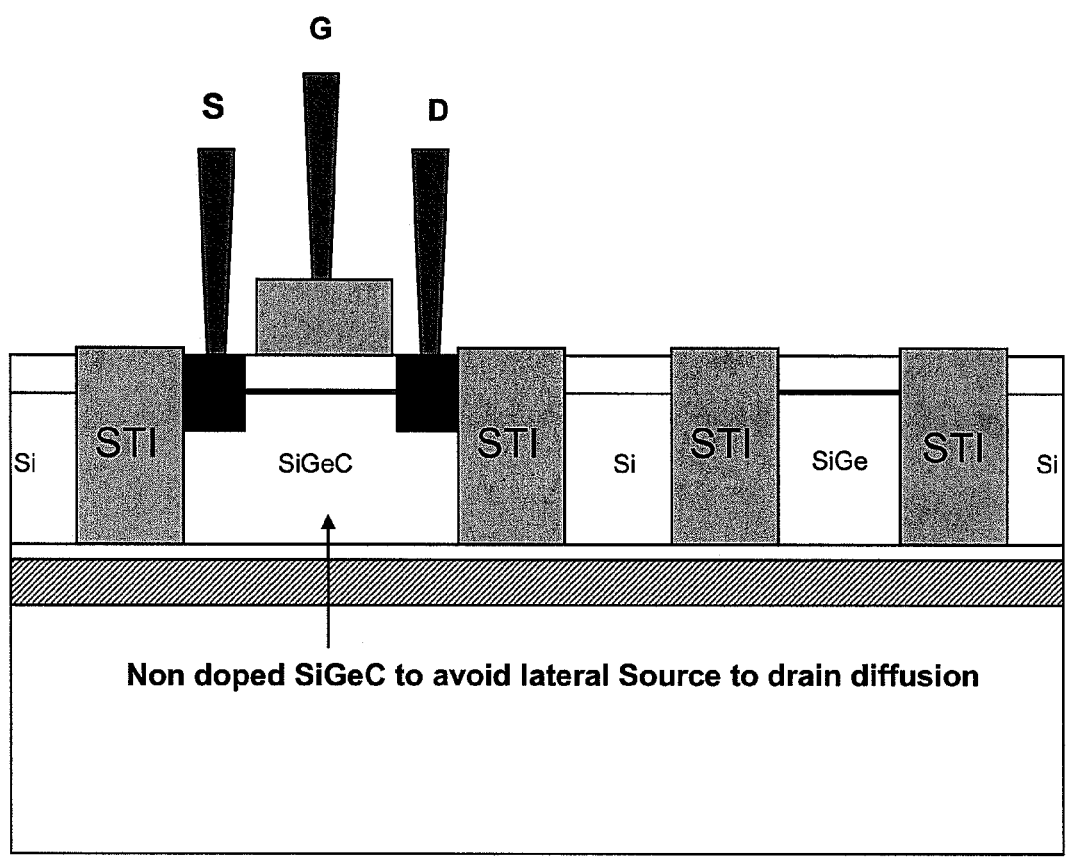
FIG. 25 shows a final structure according to an aspect of the invention.
Figure 26:
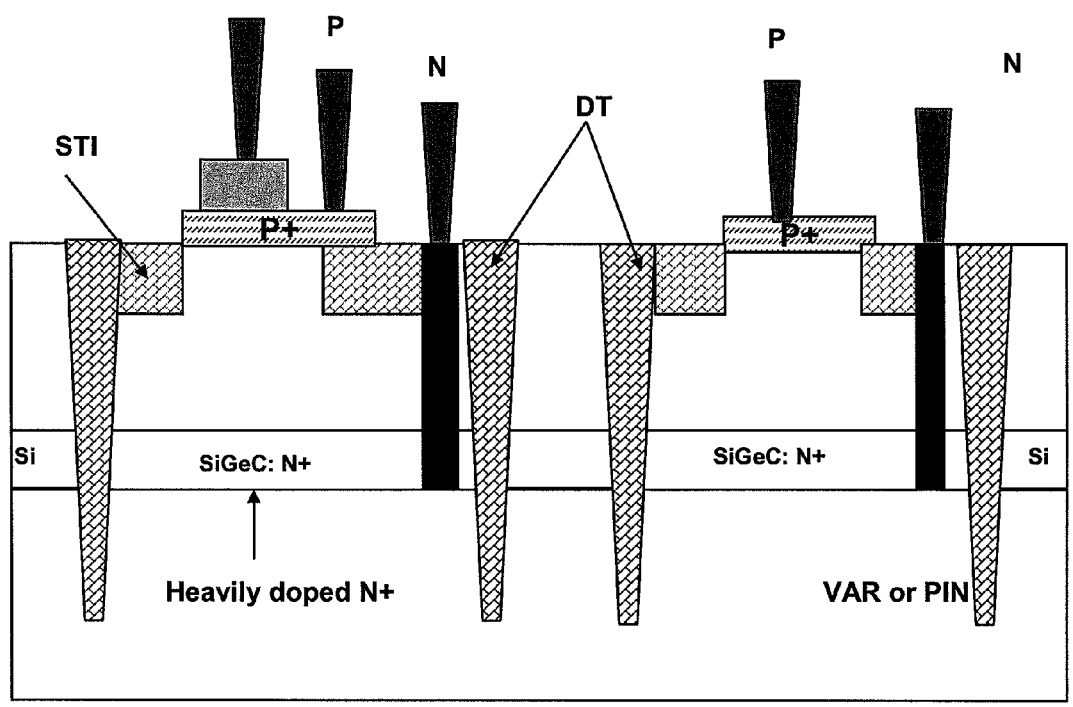
FIG. 26 shows a final structure according to an aspect of the invention.

By way of illustration, referring to FIGS. 25 and 26, final devices can be formed on the structures of the invention. For example, as shown in FIG. 25, a CMOS device may be formed on the above BOX structures described with reference to FIGS. 1-13. In FIG. 26, an HB NPN HBT structure may be formed on the structures of the invention, as well as passive devices such as varactors and PIN diodes.

Figure 27:
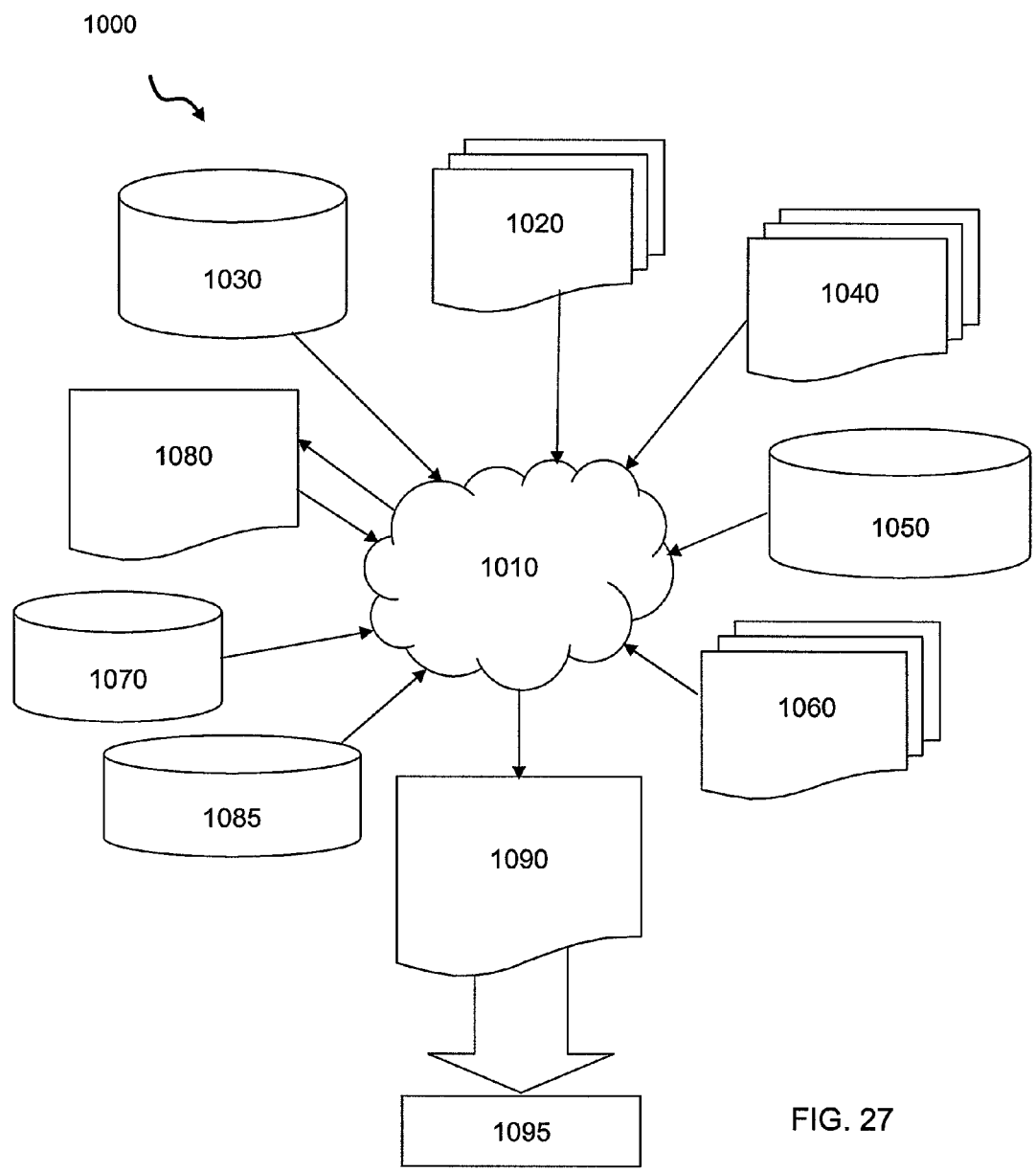
FIG. 27 is a flow diagram of a design process used in semiconductor design, manufacturing, and/or test.

FIG. 27 is a flow diagram of a design process used in semiconductor design, manufacturing, and/or test. FIG. 27 shows a block diagram of an example design flow 1000. Design flow 1000 may vary depending on the type of IC being designed. For example, a design flow 1000 for building an application specific IC (ASIC) may differ from a design flow 1000 for designing a standard component. Design structure 1020 is preferably an input to a design process 1010 and may come from an IP provider, a core developer, or other design company or may be generated by the operator of the design flow, or from other sources. Design structure 1020 comprises the circuit and/or structure of the present invention in the form of schematics or HDL, a hardware-description language (e.g., Verilog, VHDL, C, etc.). Design structure 1020 may be contained on one or more machine readable medium. For example, design structure 1020 may be a text file or a graphical representation of the circuit and/or structure of the present invention. Design process 1010 preferably synthesizes (or translates) the circuit and/or structure of the present invention into a netlist 1080, where netlist 1080 is, for example, a list of wires, transistors, logic gates, control circuits, I/O, models, etc. that describes the connections to other elements and circuits in an integrated circuit design and recorded on at least one of machine readable medium. This may be an iterative process in which netlist 1080 is resynthesized one or more times depending on design specifications and parameters for the circuit.

Design process 1010 may include using a variety of inputs; for example, inputs from library elements 1030 which may house a set of commonly used elements, circuits, and devices, including models, layouts, and symbolic representations, for a given manufacturing technology (e.g., different technology nodes, 32 nm, 45 nm, 90 nm, etc.), design specifications 1040, characterization data 1050, verification data 1060, design rules 1070, and test data files 1085 (which may include test patterns and other testing information). Design process 1010 may further include, for example, standard circuit design processes such as timing analysis, verification, design rule checking, place and route operations, etc. One of ordinary skill in the art of integrated circuit design can appreciate the extent of possible electronic design automation tools and applications used in design process 1010 without deviating from the scope and spirit of the invention. The design structure of the invention is not limited to any specific design flow.

Design process 1010 preferably translates an embodiment of the invention as shown in the accompanying figures such as, for example, FIGS. 25 and 26, along with any additional integrated circuit design or data (if applicable), into a second design structure 1090. Design structure 1090 resides on a storage medium in a data format used for the exchange of layout data of integrated circuits (e.g. information stored in a GDSII (GDS2), GL1, OASIS, or any other suitable format for storing such design structures). Design structure 1090 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in the accompanying figures such as, for example, FIGS. 25 and 26. Design structure 1090 may then proceed to a stage 1095 where, for example, design structure 1090: proceeds to tape-out, is released to manufacturing, is released to a mask house, is sent to another design house, is sent back to the customer, etc.

While the invention has been described in terms of exemplary embodiments, those skilled in the art will recognize that the invention can be practiced with modifications and in the spirit and scope of the appended claims.

It is claimed:

1. A design structure embodied in a machine readable medium for designing, manufacturing, or testing a design, the design structure comprising:
    a buried oxide (BOX) layer formed on a substrate;
    a Si film formed on the BOX layer;
    discontinuous, buried layers having alternating Si regions and SiGe or SiGeC regions, wherein the Si regions and the SiGe or SiGeC regions are formed on the Si film, and the SiGe or SiGeC regions are in troughs;
    isolation structures at an interface between the Si regions and the SiGe or SiGeC regions to reduce defects between the alternating regions;
    a Si epitaxial layer formed on the discontinuous, buried layers and the isolation structures; and
    devices associated with the Si regions and the SiGe or SiGeC regions.

2. The design structure of claim 1, wherein the design structure comprises a netlist, which describes the circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, wherein the Si regions and the SiGe or SiGeC regions are formed in physical contact with the underlying substrate.

6. The design structure of claim 1, wherein:
    the Si regions and the SiGe or SiGeC regions are formed in physical contact with and completely above the Si film; and
    the Si epitaxial layer is formed in physical contact with and completely above the discontinuous, buried layers and the isolation structures.

7. A design structure embodied in a machine readable medium for designing, manufacturing, or testing a design, the design structure comprising:
    a substrate;
    alternating Si regions and SiGe or SiGeC regions, wherein the Si regions and the SiGe or SiGeC regions are formed in physical contact with the substrate;
    isolation structures at an interface between the Si regions and the SiGe or SiGeC regions;
    a buried oxide (BOX) layer formed above the substrate;
    a first type device associated with the Si regions; and
    a second type device associated with the SiGe or SiGeC regions.

8. The design structure of claim 7, wherein the buried oxide (BOX) layer is under the SiGe or SiGeC regions.

9. The design structure of claim 7, wherein the SiGe or SiGeC regions are in troughs formed in the Si regions, and the SiGe or SiGeC regions and Si regions are discontinuous.

10. The design structure of claim 7, further comprising a Si material covering the SiGe or SiGeC regions and a poly layer covering $SiO_2$ regions formed on the Si material.

11. The design structure of claim 10, further comprising a nitride layer between the poly layer and the Si regions.

12. The design structure of claim 7, wherein the Si regions are in troughs formed in the SiGe or SiGeC regions and the SiGe or SiGeC regions and Si regions are discontinuous.

13. The design structure of claim 7, wherein SiGe or SiGeC layers are non-doped, or n-typed doped or p-typed doped.

14. The design structure of claim 7, wherein the Si regions are non-doped Si regions formed in troughs of the SiGe or SiGeC regions.

15. The design structure of claim 7, wherein the isolation structures extend through the BOX layer.

16. The design structure of claim 7, wherein the isolation structures comprise at least one of a shallow trench isolation structure, a deep trench isolation structure and a trench isolation structure.

17. The design structure of claim 7, wherein the BOX layer is under the SiGe or SiGeC regions and the SiGe or SiGeC regions are in troughs formed in the Si regions.

18. The design structure of claim 7, further comprising a Si epitaxial layer formed in physical contact with and completely above the BOX layer, wherein:
    the Si regions and the SiGe or SiGeC regions are formed completely above the substrate; and
    the BOX layer is formed completely above the SiGe or SiGeC regions.

19. A design structure embodied in a machine readable medium for designing, manufacturing, or testing a design, the design structure comprising:
- a buried oxide (BOX) layer formed on a substrate;
- a Si film formed on the BOX layer;
- discontinuous, buried layers having alternating Si regions and SiGe or SiGeC regions, wherein the Si regions are in troughs and are formed on the Si film, and the SiGe or SiGeC regions are formed above the Si film;
- isolation structures at an interface between the Si regions and the SiGe or SiGeC regions to reduce defects between the alternating regions; and
- a Si epitaxial layer formed on the SiGe or SiGeC regions.

20. The design structure of claim 19, wherein the Si regions and the SiGe or SiGeC regions are formed in physical contact with an underlying substrate.

21. The design structure of claim 19, wherein the alternating Si regions and the alternating SiGe or SiGeC regions are in a same layer.

22. The design structure of claim 19, further comprising a poly layer in direct contact with the alternating Si regions and the alternating SiGe or SiGeC regions.

23. The design structure of claim 19, further comprising a Si buffer layer formed in physical contact with and completely above the Si film, wherein:
- the Si regions are formed in physical contact with and completely above the Si film;
- the SiGe or SiGeC regions are formed in physical contact with and completely above the Si buffer layer; and
- the Si epitaxial layer is formed in physical contact with and completely above the SiGe or SiGeC regions.

* * * * *